United States Patent [19]

Cummings

[11] Patent Number: 5,125,983
[45] Date of Patent: Jun. 30, 1992

[54] GENERATING ELECTRIC POWER FROM SOLAR RADIATION

[75] Inventor: Richard D. Cummings, Reading, Mass.

[73] Assignee: Electric Power Research Institute, Inc., Palo Alto, Calif.

[21] Appl. No.: 690,194

[22] Filed: Apr. 22, 1991

[51] Int. Cl.$^5$ ............... H01L 31/048; H01L 31/08; H01L 31/052

[52] U.S. Cl. ............ 136/246; 136/251; 437/2; 437/205; 228/58; 228/179; 228/180.1; 228/180.2

[58] Field of Search ............ 136/246, 251, 259; 437/2, 205, 209; 228/58, 179, 180.1, 180.2

[56] References Cited

U.S. PATENT DOCUMENTS

| | | | |
|---|---|---|---|
| 3,574,725 | 4/1971 | Schneider et al. | 228/180 R |
| 3,874,931 | 4/1975 | Haynos | 136/244 |
| 4,336,413 | 6/1982 | Tourneux | 136/251 |
| 4,357,400 | 11/1982 | Appleby | 429/111 |
| 4,454,372 | 6/1984 | Appleby | 136/250 |
| 4,836,861 | 6/1989 | Peltzer et al. | 136/246 |
| 4,927,770 | 5/1990 | Swanson | 437/2 |
| 4,933,021 | 6/1990 | Swanson | 136/249 MS |
| 4,933,022 | 6/1990 | Swanson | 136/249 MS |

OTHER PUBLICATIONS

B. Todorof, *Conf. Record, 20th IEEE Photovoltaic Specialists Conf.* (1988), pp. 1347–1352.

Levy et al.; Black & Veatch, Engineers–Architects; High–Concentration Photovoltaic Module Design; Interim Report, Aug. 1986, EPRI AP-4752, Project 1415-7.

Levy; Black & Veatch, Engineers–Architects; Conceptual Design for a High-Concentration (500X) Photovoltaic Array; Interim Report, Dec. 1984, EPRI AP-3263, Project 1415-7.

Swanson; Stanford University; Point-Contact Silicon Solar Cells; Interim Report May 1983, EPRI AP-2859, Project 790-2.

Moore et al.; Opening the Door for Utility Photovoltaics; *EPRI Journal;* pp. 5–15; Jan./Feb. 1987.

Chiang et al.; Sandia's Concept-90 Photovoltaic Concentrator Module; *Proceedings 21st IEEE Photovoltaic Specialists Conference* (1990), pp. 887–890.

Carroll et al.; Production of the Alpha Solarco Proof-Of-Concept Array; *Proceedings 21st IEEE Photovoltaic Specialists Conference* (1990), pp. 1136–1141.

Kuryla et al.; 22.7% Efficient 1000K GaAs Concentrator Module; Proceedings 21st IEEE Photovoltaic Specialists Conference (1990), pp. 1142–1146.

*Primary Examiner*—Aaron Weisstuch
*Attorney, Agent, or Firm*—Fish & Richardson

[57] ABSTRACT

An extensive photovoltaic array for generating electric power from solar radiation as in a power plant includes an extensive unitary structural grid having substantial extent in both x and y directions and supported on a pedestal. The unitary structural grid is defined by a multiplicity of structural members connected to one another at angles and defining spaces therebetween. The structural grid has a depth sufficient to provide structural rigidity to the photovoltaic array. A large multiplicity of lens assemblies, each including at least one lens, is directly supported by and in spaces defined between structural members of the unitary structural grid. The lens assemblies close the upper side of the unitary structural grid. All other sides of the unitary structural grid are also closed. A plurality of solar cells are located within spaces defined between structural members of the structural grid and positioned to receive solar radiation that passes through respective lenses of the lens assemblies. The lens assemblies and the structural members of the structural grid have an integrated relationship.

43 Claims, 12 Drawing Sheets

GENERATING ELECTRIC POWER FROM SOLAR RADIATION

BACKGROUND OF THE INVENTION

This invention relates to the generation of electric power from solar radiation, and more particularly relates to photovoltaic arrays and similar devices in which solar radiation passes through a set of lenses that focus the radiation onto a set of solar cells that generate electricity.

The following publications of the Electric Power Research Institute are representative of the prior art and are hereby incorporated in their entirety by reference: "High-Concentration Photovoltaic Module Design," EPRI AP-4752, Aug., 1986; "Conceptual Design for a High-Concentration (500X) Photovoltaic Array," EPRI AP-3263, Dec., 1984; and "Point-Contact Silicon Solar Cells," EPRI AP-2859, May, 1983.

As disclosed in these publications, a typical photovoltaic array is constructed of a set of 60 "modules" in the form of rectangular metal boxes. The top surface of each module includes a pair of lens assemblies or "parquets." Each lens "parquet" is a transparent sheet that includes a set of 24 lenses that focus solar radiation onto a set of respective solar cells located inside the module. The peripheries of the lens parquets are fitted with polymer seals to reduce leakage of water into the module. The 60 modules are mounted onto a structural grid to form the photovoltaic array, the structural grid being supported by a vertical pedestal post.

Inside each module, each of the 24 solar cells forms part of a respective cell package. Each cell package consists of a metal mounting plate that functions as a heat spreader, a flat, ceramic electrical insulator that is soldered on top of the mounting plate, a pair of electrodes that are soldered on top of the electrical insulator and are electrically isolated from the mounting plate, a flat, silicon solar cell that is soldered on top of the pair of electrodes and is thereby electrically connected to the electrodes, and a four-sided, prismatic reflector or "secondary optical element" that is bonded to the top of the solar cell and that directs, by means of reflection, solar radiation that would otherwise miss the active area of the cell toward the active area of the solar cell.

Inside each module, four solar cells connected in series are connected in parallel with four other solar cells connected in series. There are six such sets of eight solar cells, the six sets being connected in series.

SUMMARY OF THE INVENTION

The invention features several different techniques for minimizing the cost of generating electrical power from solar radiation, by providing hardware that is highly efficient (high amount of electrical energy for a given amount of solar radiation), by providing low-cost construction techniques, by eliminating hardware components, and by eliminating problems due to water leakage and condensation.

In one aspect, the invention features an extensive photovoltaic array for generating electric power from solar radiation as in a power plant. The array includes an extensive unitary structural grid having substantial extent in both x and y directions and supported on a pedestal. The unitary structural grid is defined by a multiplicity of structural members connected to one another at angles and defining spaces therebetween. The structural grid has a depth sufficient to provide structural rigidity to the photovoltaic array. A large multiplicity of lens assemblies, each including at least one lens, is directly supported by and in spaces defined between structural members of the unitary structural grid. The lens assemblies close the upper side of the unitary structural grid. All other sides of the unitary structural grid are also closed. A plurality of solar cells are located within spaces defined between structural members of the structural grid and positioned to receive solar radiation that passes through respective lenses of the lens assemblies. The lens assemblies and the structural members of the structural grid have an integrated relationship.

In another aspect the invention features a device for generating electrical power from solar radiation, the device including a circuit board plate comprised of a planar electrically insulative layer, an upper electrically and thermally conductive layer supported by and in heat-transferring relationship to the electrically insulative layer, and a thermally conductive heat sink member extending under the electrically insulative member in heat transferring relationship therewith. The upper electrically conductive layer is interrupted so that adjacent portions thereof are electrically isolated and also serve as positive and negative conductors. A solar cell spans across a region of interruption in the upper electrically conductive layer and is secured in electrical and heat conductive relationship to positive and negative portions of the conductive layer.

In another aspect, the invention features a photovoltaic array that includes a large multiplicity of coplanar lens assemblies closing an upper side of the photovoltaic array. A plurality of solar cells are located below the lens assemblies. The array includes a plurality of water shield plates, each of the water shield plates including a first section located beneath an edge margin of a first of the lens assemblies, a second section located above an edge margin of a second of the lens assemblies, and a vertical water-interception surface extending between the first and second sections, constructed to intercept water and to prevent such water from entering beneath the second of the lens assemblies. The array also includes a plurality of gutters located beneath gaps between the co-planar lens assemblies and arranged to capture water that passes into the gaps and to capture water intercepted by the vertical water-interception surface of the water shield plates and to channel captured water off of the photovoltaic array, thereby preventing captured water from entering the photovoltaic array.

In another aspect, the invention features a method of manufacturing a device for generating electric power from solar radiation. A soldering flux is applied to a circuit board plate. A cell placement fixture is positioned over the circuit board plate, the circuit board plate having structures that engage the cell placement fixture to provide precise positioning of the cell placement fixture on the circuit board plate. A soldering foil is placed on a region of the circuit board plate that is unobstructed by the cell placement fixture, the cell placement fixture having sides that engage the soldering foil during placement of the soldering foil on the region of the circuit board plate. The soldering foil is melted. A soldering flux is applied to a solar cell. The solar cell is placed over melted solder resulting from melting of the soldering foil, the cell placement fixture having sides that engage the solar cell during placement of the solar cell on the region of the circuit board plate. The melted solder is permitted to cool, to provide at least one solder connection between the solar cell and the circuit board plate. The cell placement fixture is removed from the circuit board plate.

Other advantages and features will become apparent from the following detailed description and from the claims.

DETAILED DESCRIPTION

We first briefly describe the drawings.

DRAWINGS

Structure, Manufacture, and Operation

Figure 1:
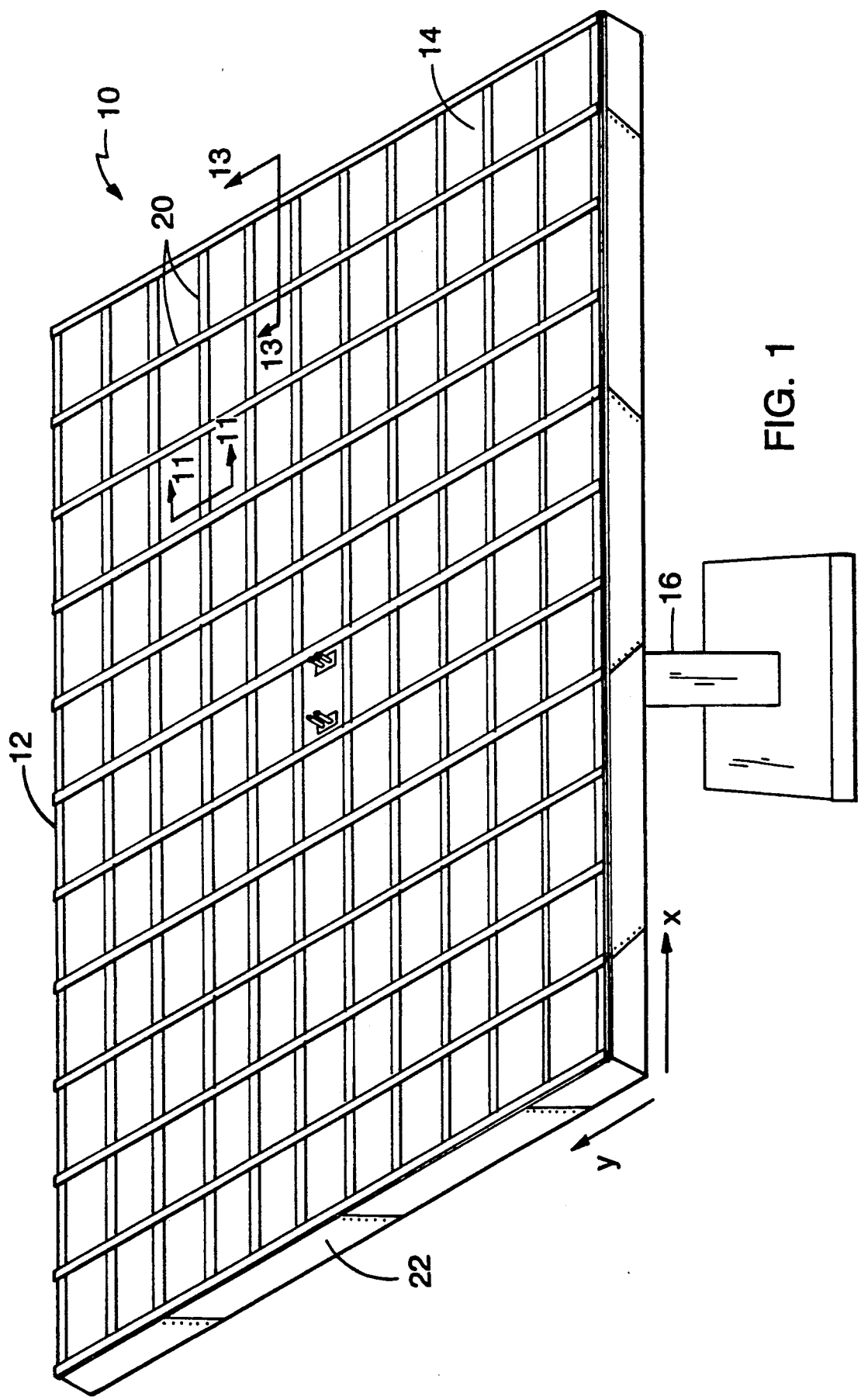
FIG. 1 is a frontal view of a photovoltaic array in accordance with the invention.
Figure 2:
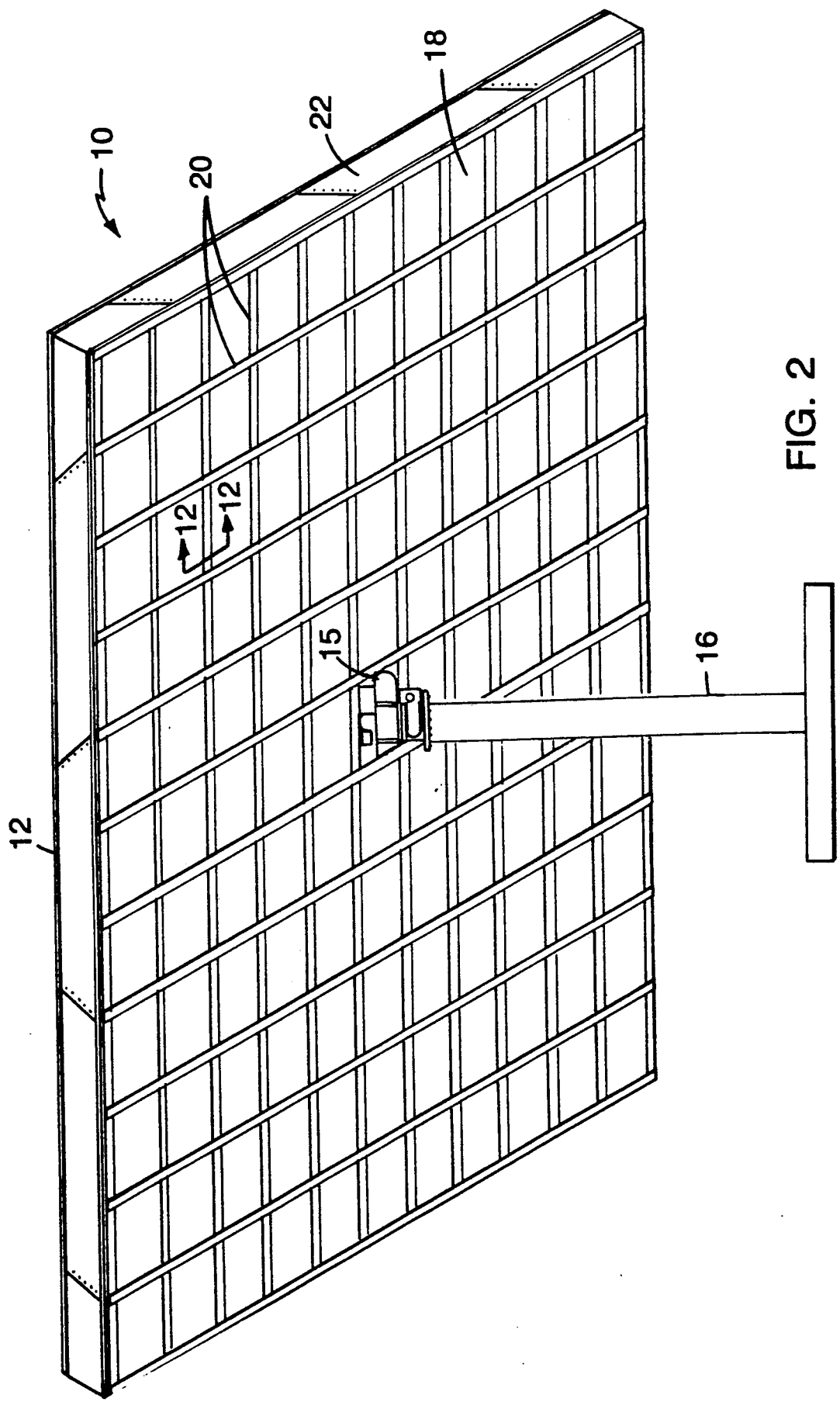
FIG. 2 is a rear view of the photovoltaic array of FIG. 1.
Figure 3:
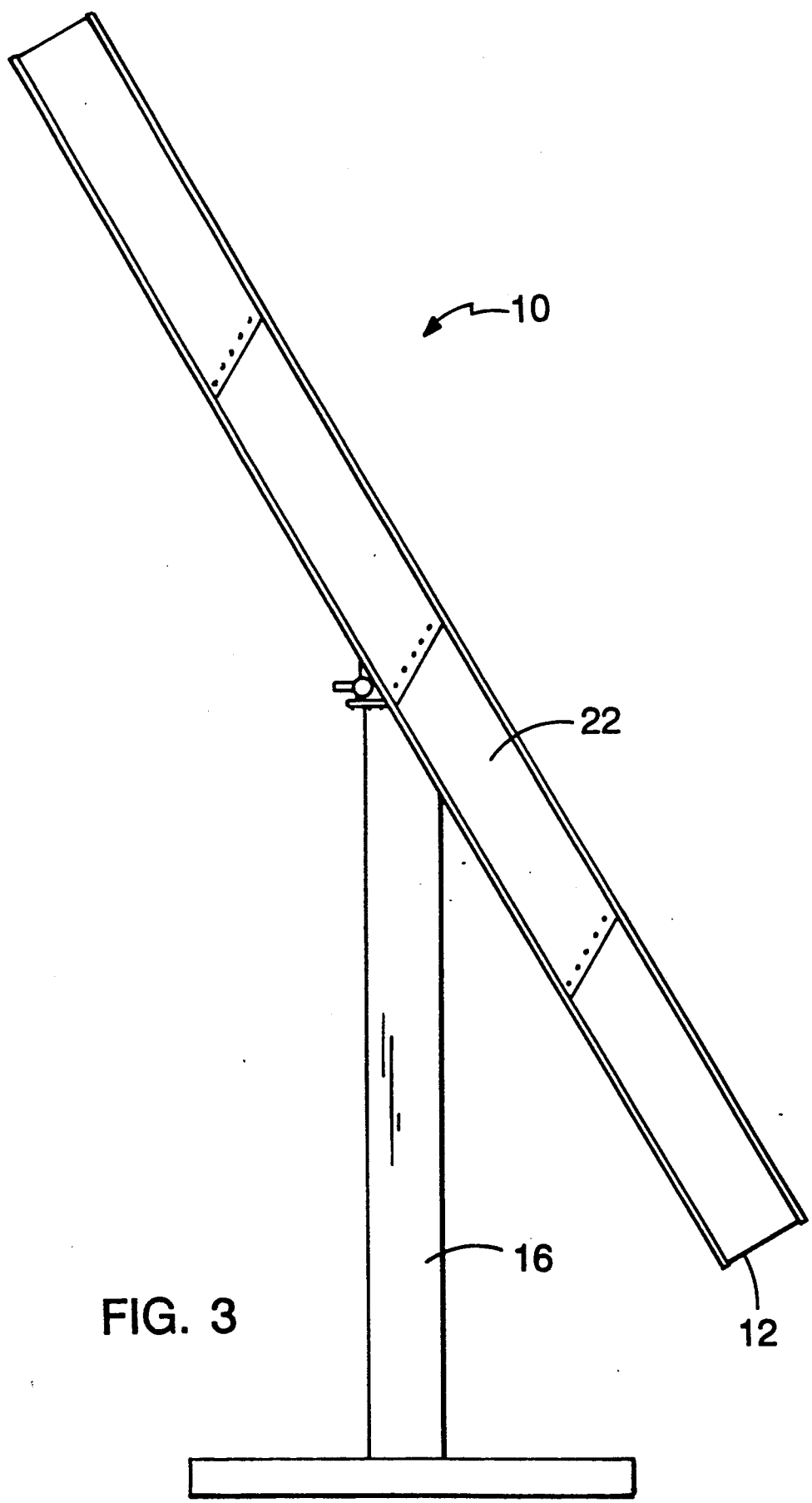
FIG. 3 is a side view of the photovoltaic array of FIG. 1.

With reference to the drawings, and particularly to FIGS. 1, 2, and 3 thereof, photovoltaic array 10, which may be combined with a large number of similar photovoltaic arrays to form a power plant, consists of a single enclosure 12 having dimensions of 42¼ feet by 29½ feet by 20 inches. Enclosure 12 is supported by an internal unitary structural grid (shown in FIGS. 11-13), which is in turn supported by vertical pedestal post 16. Pedestal post 16 interfaces with the internal structural grid through a drive mechanism 15 that positions the internal structural grid of the array so that lens parquets 14 face the sun. The single-enclosure design minimizes the number of parts and amount of materials needed to enclose the solar cells and the electrical circuitry inside photovoltaic array 10.

The front face of enclosure 12 includes 120 lens parquets 14 (eleven rows by eleven columns of lens parquets, minus one lens parquet at the location at which vertical pedestal post connects with enclosure 12), each of which includes 24 Fresnel lenses (four rows by six columns) that focus solar radiation onto respective solar cells located within enclosure 12. The rear face of enclosure 12 includes 120 circuit board plates 18 on which the solar cells are mounted and to which the solar cells are electrically connected. Trim battens 20 are provided on the front and rear faces of enclosure 12 over the edge regions of lens parquets 14 and circuit board plates 18. The side surfaces of enclosure 12 are constructed of sheet metal siding 22. The components located within enclosure 12 are constructed so as not to ignite upon being exposed to concentrated solar radiation.

The "integrated" photovoltaic array design shown in FIGS. 1-3 utilizes a minimal amount of hardware. Another advantage of this design is the ease with which the parts of the array can be shipped for on-site assembly. For example, circuit board plates 18 can be stacked one on top of another in a truck until the truck reaches its weight limit. There is no need to ship large module boxes that weigh little but occupy much space.

Figure 4:
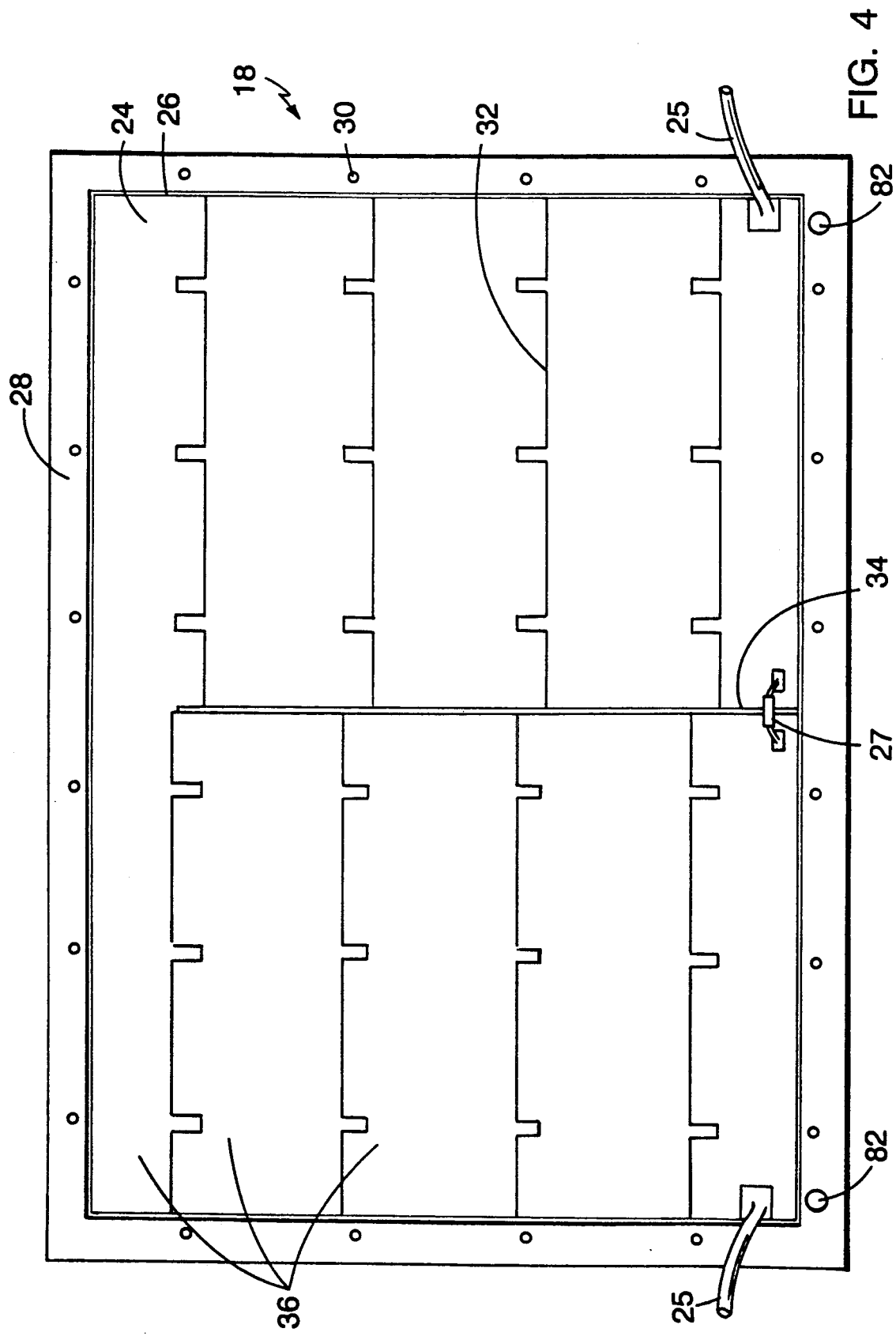
FIG. 4 is a drawing of a circuit board in accordance with the invention designed for use in a photovoltaic array.
Figure 7:
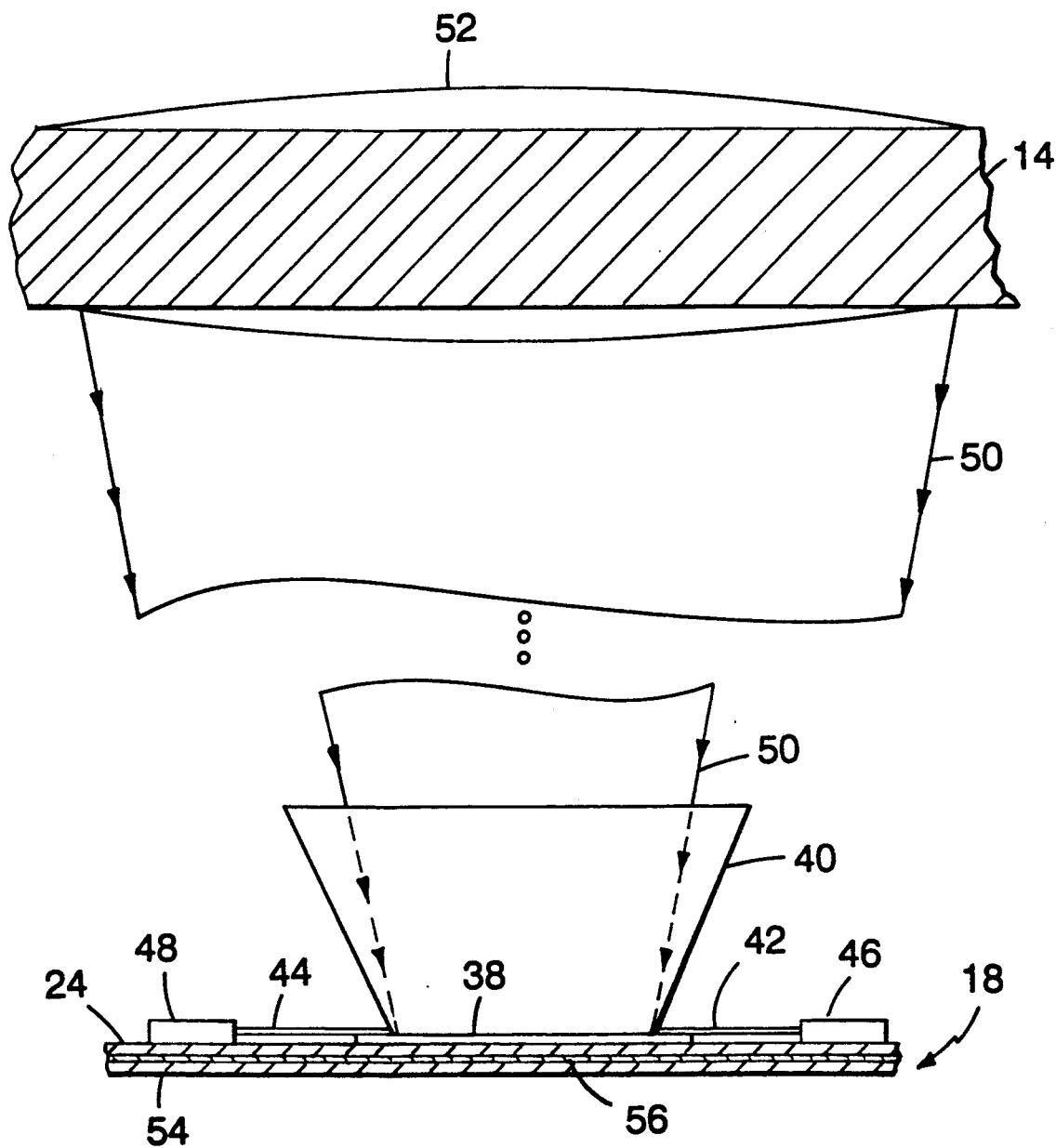
FIG. 7 is a drawing, partially in section, showing a lens focusing solar radiation onto a solar cell in accordance with the invention.

With reference to FIG. 4, each circuit board plate 18 is 45.75 inches long and 31.75 inches wide and has a copper top layer 24 and an aluminum rear layer separated by an electrically insulative layer (as shown in FIG. 7) formed of fiberglass impregnated with epoxy. Copper top layer 24 provides electrical circuit paths to which the solar cells are connected, while the thermally conductive aluminum rear layer acts as a heat sink surface, the fiberglass-epoxy electrically insulative layer electrically insulating top layer 24 from the rear layer.

Figure 13:
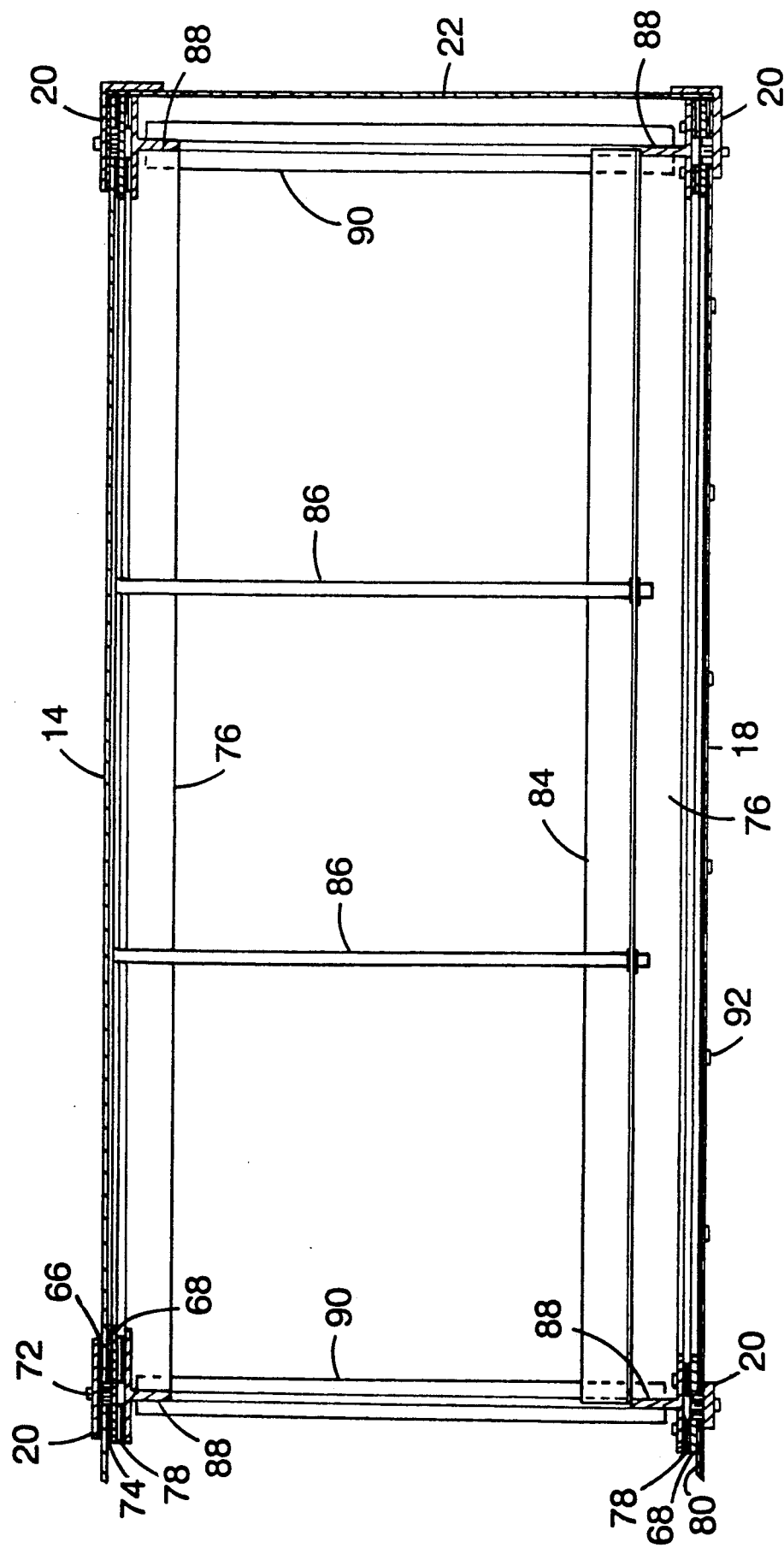
FIG. 13 is a sectional view of a portion of a photovoltaic array in accordance with the invention, taken along line 13—13 in FIG. 1.

Top layer 24 includes an etch line 26 that is 0.100 inches wide, plus or minus 0.002 inches, the center line of which is 2.62 inches from each of the edges of circuit board plate 18. Etch line 26 creates an interruption in top layer 24 (a depression through top layer 24 down to the electrically insulative layer) that electrically isolates the internal portions of top layer 24 from edge region 28. Edge region 28 includes twenty 0.190-inch screw holes 30 spaced apart every seven inches and centered 1.72 inches from the top of etch line 26, which are used for mounting circuit board plate 18 to a gasket located underneath circuit board plate 18 (as shown in FIG. 13). Edge region 28 also includes weep holes 82, ⅜ inch in diameter, drilled through the circuit board plate, which provide outlets for water that accumulates within the array enclosure due to leakage or condensation. Although drill holes 30 and weep holes 82 create a short circuit between edge region 28 and the aluminum rear layer of circuit board plate 18, edge region 28 is electrically isolated from the internal portions of top layer 24 that function as electrical circuit paths.

Longitudinal etch lines 32 and transverse etch line 34 divide the internal portions of top layer 24 into copper circuit-path strips 36. Thus, etch lines 32 and 34 create interruptions in top layer 24 (depressions through top layer 24 down to the electrically insulative layer) that electrically isolate adjacent circuit-path strips 36 so that adjacent circuit-path strips 36 can serve as positive and negative conductors with respect to solar cells that span across a longitudinal etch line 32 and that are secured in electrical (and heat conductive) relationship to the two adjacent circuit-path strips 36 separated by the longitudinal etch line 32. Longitudinal etch lines 32 are 0.028 inches wide, plus or minus 0.002 inches, and transverse etch line 34 is 0.100 inches wide, plus or minus 0.002 inches. Bypass diode 27, which is connected between the first and last circuit-path strips 36, bypasses the circuit board in the event of a failure of one or more solar cells, in order to prevent damage to the remaining solar cells.

Figure 5:
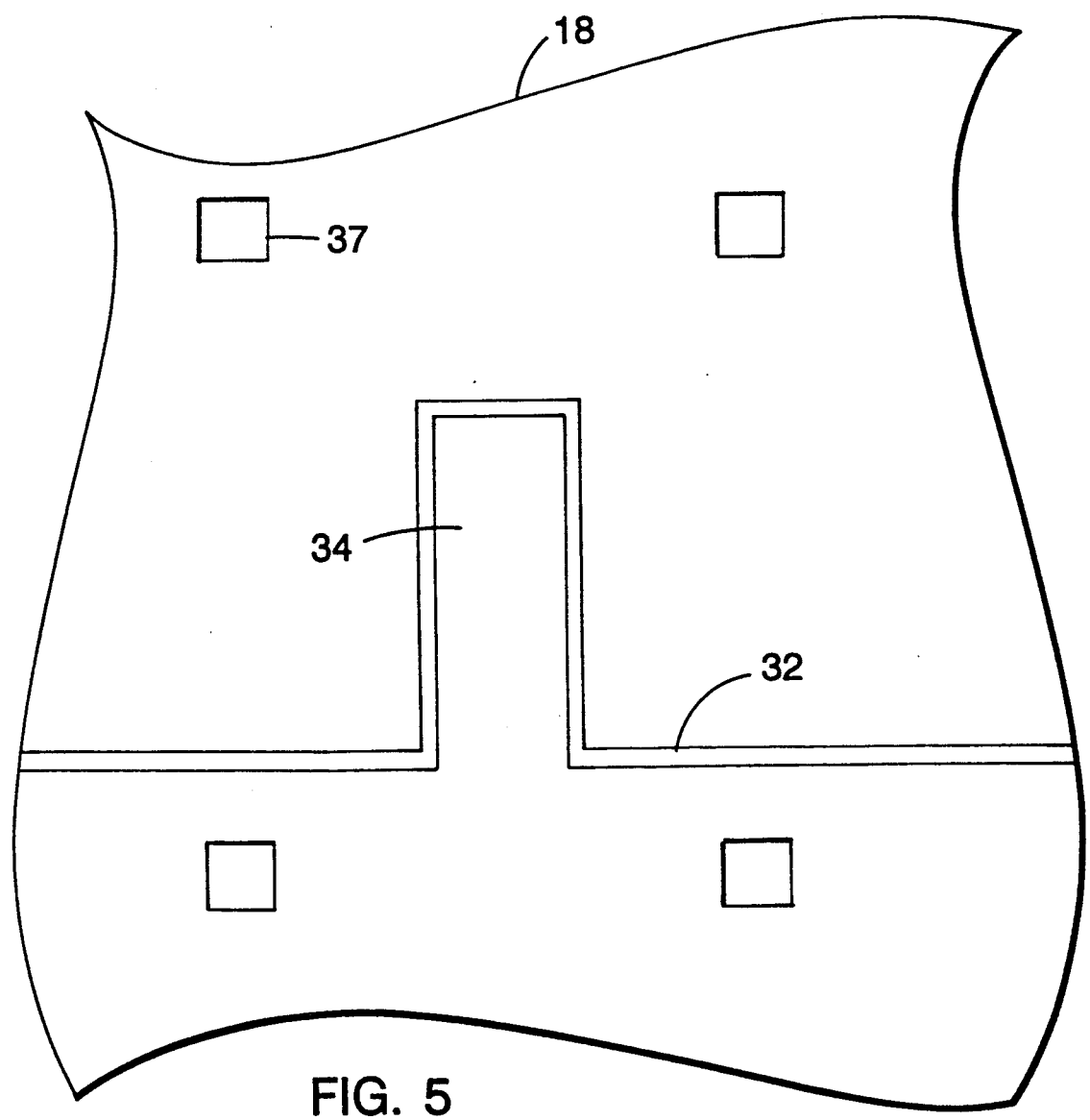
FIG. 5 is a detailed drawing of a portion of the circuit board of FIG. 4.

With reference to FIG. 5, there is shown a detail of a portion of circuit board plate 18 in the vicinity of a longitudinal etch line 32. Longitudinal etch line 32 includes a portion that surrounds a tooth-shaped region 34 that is 0.195 inches wide and 0.467 inches long and over which a solar cell is located (as shown in FIG. 6).

Four square depressions 37 in the copper top layer of circuit board plate 18, 0.100 inch by 0.100 inch, are used to hold the legs of a cell placement fixture (shown in FIGS. 7 and 8) that is used during soldering of the solar cell to circuit board 18. Two square depressions each are centered 0.395 inches to the left and 0.395 inches to the right of the center line of tooth-shaped region 34. The two bottom square depressions are centered 0.232 inches below the bottom of etch line 32, and the two top square depressions are centered 0.900 inches above the two bottom square depressions. Each set of four square depressions 37 is centered around a point that is located at the intersection of a vertical line between two drill holes 30 (FIG. 4) and a horizontal line between two drill holes 30.

Figure 6:
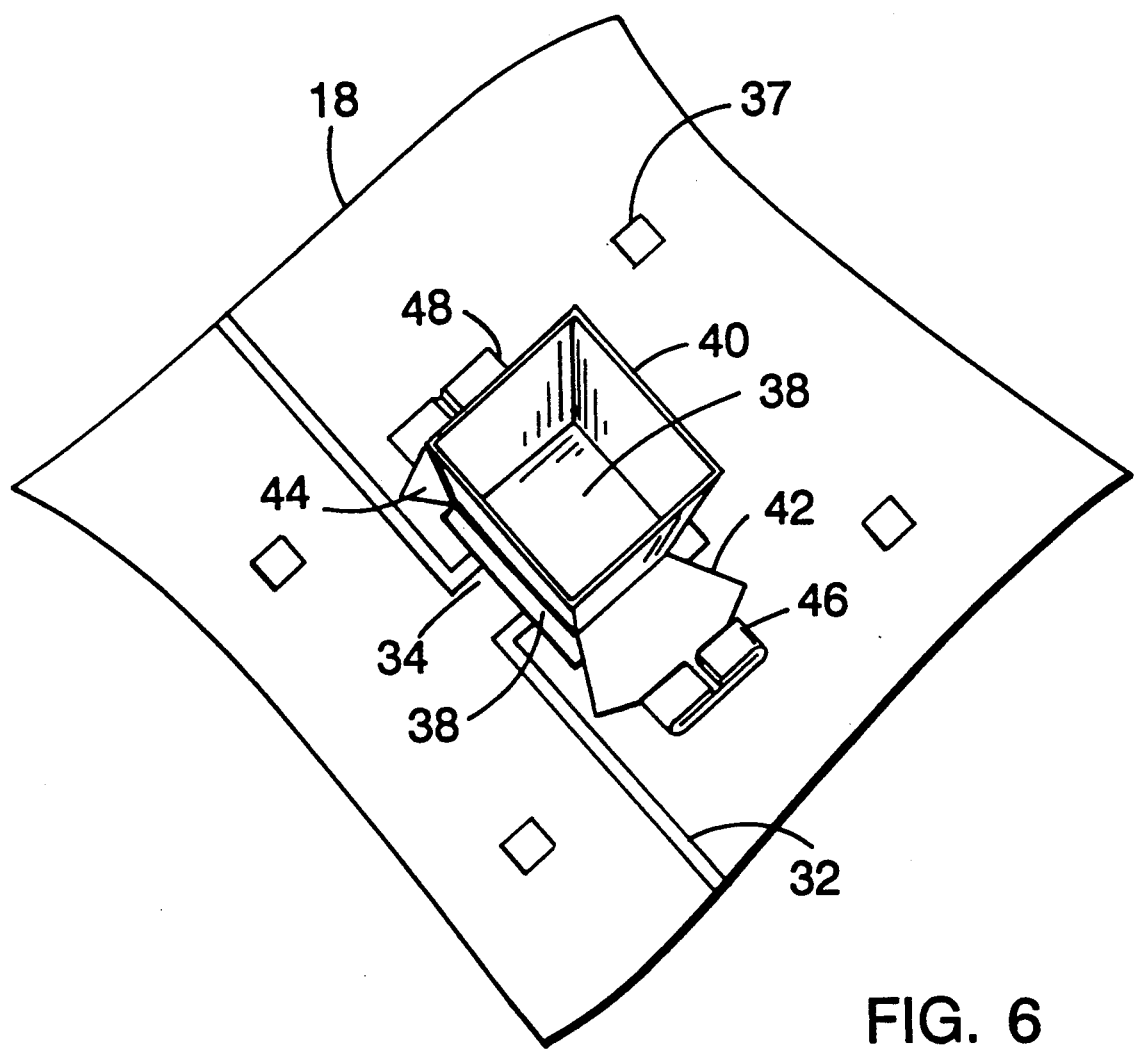
FIG. 6 is a drawing of a solar cell and a secondary optical element in accordance with the invention mounted on a portion of a circuit board.

FIGS. 6 and 7 both illustrate a square, silicon, back-contact solar cell 38 mounted on a portion of circuit board plate 18, and a four-sided, prismatic reflector or "secondary optical element" 40 mounted on top of solar cell 38. Secondary optical element 40 directs, by means of reflection, solar radiation that would otherwise miss the active area of solar cell 38 toward the active area of solar cell 38, the "active area" of the solar cell being the area that is exposed between the four sides of secondary optical element 40. The active area of solar cell 38 has dimensions of 1.265 centimeters by 1.265 centimeters.

Solar cell 38 puts out approximately $6\frac{1}{4}$ watts of power, at approximately $9\frac{1}{2}$ amps and approximately 0.65 volts. The entire array, which includes 2,880 solar cells, consequently puts out approximately 18,000 watts of power.

Solar cell 38 has a back surface that includes multiple gold contact sections separated by silicon semiconductor material. Solar cell 38 is soldered onto circuit board plate 18 directly over tooth-shaped region 34. Tooth-shaped region 34 is electrically connected to one of the gold contact sections of solar cell 38, and the adjacent circuit-path strip on circuit board plate 18 is also electrically connected to at least one other gold contact section of solar cell 38.

It can be seen, by referring back to FIG. 4, that circuit board plate 18 provides a circuit in which solar cells are connected in parallel with each other in sets of three, eight of these sets being connected in series. Each circuit board plate is connected in series with another circuit board plate by a strap 25 equivalent to a number 4 wire, the strap being located entirely within the array enclosure to avoid exposure to weather. By connecting each solar cell directly in parallel with at least one other solar cell (connecting each solar cell directly between a pair of circuit nodes between which at least one other solar cell is directly connected in parallel), the adverse effects of the presence of a weak cell are minimized. A weak cell has an IV curve (voltage as a function of current) that crosses zero volts at a current that is less than the current at which the IV curve of a strong cell crosses zero volts. The IV curve of any cell drops off steeply after crossing through zero volts. When a weak cell is connected directly in series with one or more strong cells, and the load across the series-connected cells is sufficiently low, the strong cell or cells force a current through the weak cell that causes the weak cell to develop a negative voltage that is large enough to counteract the positive voltages produced by each of the strong cells, causing overall power production to suffer. When a weak cell is connected directly in parallel with one or more strong cells, however, the strong cell or cells force a positive voltage potential across the weak cell, and the weak cell consequently puts out less current than the strong cell or cells. Although the weak cell puts out less current than the strong cells, the weak cell is nevertheless contributing to power production, rather than detracting from power production by cancelling out the power production of other solar cells.

With reference again to FIGS. 6 and 7, copper tabs 46 and 48, which are soldered onto circuit board plate 18, secure secondary optical element 40 over solar cell 38 by securing wing portions 42 and 44, which are attached to two of the sides of secondary optical element 40 at the base region. Each of the sides of prismatic secondary optical element 40 forms an angle of 25 degrees with respect to the vertical direction.

With reference to FIG. 7, the distance between seven inch by seven inch Fresnel lens 52 in lens parquet 14 and solar cell 38 is slightly less than 20 inches. At this lens-cell separation distance, lens 52, which has a focal length of 20 inches, directs a beam 50 of solar radiation toward the active area of solar cell 38 in a manner such that the beam is concentrated down to a pattern on solar cell 38 having dimensions that equal the dimensions of the active area of solar cell 38. Because lens 52 is a Fresnel lens, there is chromatic aberration of the light that comes out of the lens, light of each color having its own focal point. Consequently, the edges of the pattern on solar cell 38 consist of red light only, because red light, which has the longest wavelength in the visible spectrum, has a focal point that is further from lens 52 than light of any other color.

The inside reflective surfaces of secondary optical element 40 do not reflect any substantial portion of radiation beam 50 unless there is misalignment between lens 52 and solar cell 38 or misalignment between lens 52 and the sun. If there is misalignment, the inside reflective surfaces of secondary optical element 40 reflect all radiation that is incident on the inside reflective surfaces toward the active area of the solar cell.

Note that, for light of any given wavelength, the focal point of the solar radiation of that wavelength is located below a plane that passes through solar cell 38 and that is parallel to lens 52. It is beneficial not to have any focal points located above the plane that passes through solar cell 38. If any focal points were located above the solar cell, solar radiation would "cross over" the vertical optical axis at the focal points. It would be necessary to construct the sides of prismatic secondary optical element 40 at a relatively narrow angle with respect to the vertical direction, in order to prevent crossed-over radiation that hits one inside surface of secondary optical element 40 from being reflected toward the inside surface on the opposite side of the secondary optical element, and from the inside surface on the opposite side being reflected out of secondary optical element 40. If all focal points are located at or below the location of solar cell 38, secondary optical element 40 can be constructed with sides that form an angle with respect to the vertical direction that is great enough to permit secondary optical element 40 to be relatively forgiving of misalignment errors between lens 52 and solar cell 38. Of course, even if all focal points of the solar radiation are located at or below the location of solar cell 38, if the sides of secondary optical element 40 were constructed at an angle that is too great with respect to the vertical direction the radiation that hits one inside surface of secondary optical element 40 would be reflected toward the inside surface on the opposite side of the secondary optical element, and from the inside surface on the opposite side would be reflected out of the secondary optical element.

The ratio of concentration of solar radiation incident on solar cell 38 relative to the concentration of the solar radiation before passing through lens 52 is preferably between 150 and 250. When the ratio of concentration is too high, the photons from the solar radiation, which are supposed to dislodge electrons in the semiconductor material of solar cell 38, begin to saturate the solar cell. Consequently, solar cell 38 yields fewer and fewer electrons per photon, and hence yields less current, as the ratio of concentration increases. The peak efficiency of solar cell 38 is achieved at a concentration ratio of approximately 200.

With reference still to FIG. 7, circuit board plate 18 is a laminate that includes top copper layer 24, having a thickness of approximately 0.002 inches, which provides electrical circuit paths to which the solar cells are connected, rear aluminum layer 54, having a thickness of approximately 0.030 inches, which functions as a heat sink, and internal, electrically insulative layer 56, having a thickness of approximately 0.003 inches, which is preferably a layer of fiberglass impregnated with epoxy. Dried fiberglass-epoxy layer 56 is epoxied to copper layer 24 and aluminum layer 54. Although the epoxy is electrically insulative, an electrical short could be created in a layer of epoxy alone when copper layer 24 and aluminum layer 54 are pressed together while the epoxy is liquid. The presence of fiberglass in fiberglass-epoxy layer 56 prevents copper layer 24 and aluminum layer 54 from contacting each other when copper layer 24 and aluminum layer 54 are pressed together while the epoxy is liquid. Fiberglass-epoxy layer 56 has a dielectric strength of approximately 4000 volts, yet the temperature drop across fiberglass-epoxy layer 56 is only approximately 11 degrees fahrenheit. Note that both the dielectric strength of the fiberglass-epoxy layer and the temperature drop across the fiberglass-epoxy layer increase as a function of the thickness of the fiberglass-epoxy layer. The epoxy that is used in conjunction with the fiberglass to form fiberglass-epoxy layer 56 and the epoxy that is used to adhere copper layer 24 and fiberglass-epoxy layer 56 together must be chosen so as not to cause circuit board plate 18 to come apart at high temperatures. Circuit board plate 18 may be tested by heating the circuit board plate up to 420 degrees fahrenheit to determine whether the circuit board plate will come apart.

It is important that the dielectric strength of electrically insulative layer 56 be high, because the photovoltaic array includes the series connection of 960 sets of three solar cells connected in parallel, each set of parallelly connected solar cells producing a voltage that is approximately 0.65 volts higher than the voltage produced by the previous set. In an alternative embodiment the photovoltaic array includes the series connection of 1440 sets of two solar cells connected in parallel, in which case voltages as high as 900 volts can be built up inside the photovoltaic array.

Electrical insulators typically have a low thermal conductivity. Nevertheless, it is important that the temperature drop across electrically insulative layer 56 be as low as possible. Approximately 25 percent of the solar radiation that enters the photovoltaic array is converted into electrical power and the other 75 percent is absorbed by the photovoltaic array as heat. When the temperature of the silicon in a solar cell is raised the voltage across the solar cell drops. Consequently, if fiberglass-epoxy electrically insulative layer 56 were too thick, the solar cells would heat up to a point at which the efficiency of the solar cells would be reduced.

As an alternative to using a fiberglass-epoxy layer, the top surface of aluminum layer 54 may be black anodized, to create an anodized electrically insulative film that makes up electrically insulative layer 56. The anodized electrically insulative film, which is epoxied to copper layer 24, has a dielectric strength of approximately 800 volts. The epoxy has a thickness of approximately 0.001 inches. This alternative method of constructing the circuit board plate can be used in a photovoltaic array in which the solar cells are interconnected in a manner such that the maximum voltage potential across the circuit board plate is 300 volts, e.g., an array that includes the series connection of 480 sets of six solar cells connected in parallel. Recall that when solar cells are connected in series, voltages add, whereas when solar cells are connected in parallel, currents add.

Figure 8:
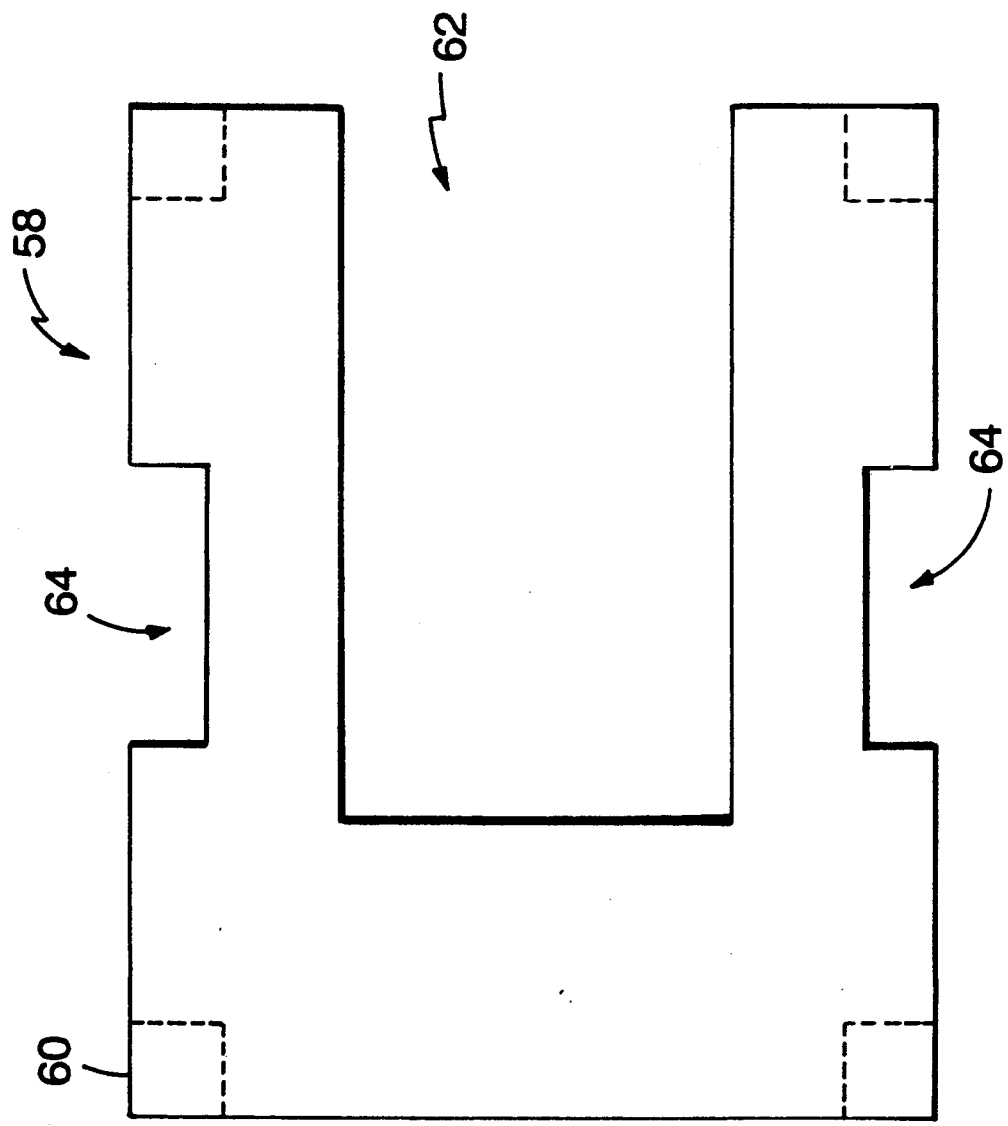
FIG. 8 is a drawing of a cell placement fixture in accordance with the invention designed for use in mounting a solar cell onto a circuit board.
Figure 9:
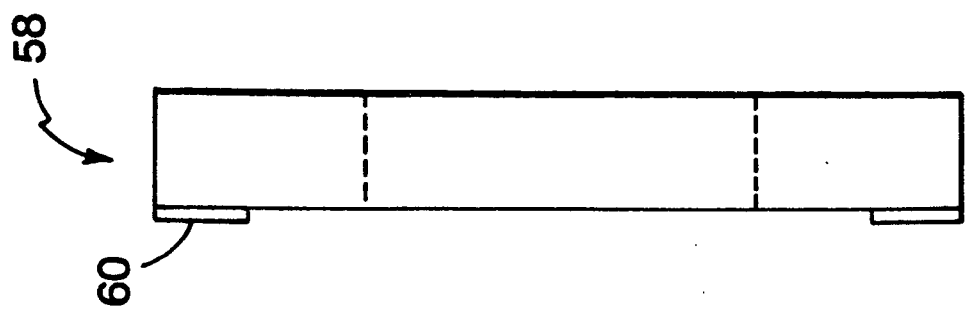
FIG. 9 is a side view of the cell placement fixture of FIG. 8.

The solar ell should be positioned on the circuit board plate with an accuracy of plus or minus 0.005 inches with respect to all other solar cells. With reference to FIGS. 8 and 9, aluminum cell placement fixture 58 is used as a physical guide during the soldering process by which the solar cell and the copper tabs are attached to the circuit board plate, to achieve an accuracy in the placement of the solar cell and the copper tabs on the circuit board plate of plus or minus 0.002 inches. Cell placement fixture 58 is 1.088 inches long by 0.888 inches wide by 0.125 inches thick (excluding the thickness of legs 60). The four legs 60, having dimensions of 0.098 inches by 0.098 inches by 0.010 inches, are designed to fit into square depressions 37 in the circuit board plate (FIG. 6).

In the method of soldering solar cells to the circuit board plate, flux is first applied to the circuit board plate. Then cell placement fixtures 58 are placed over each location on the circuit board plate at which a solar cell is to be soldered to the circuit board plate. Center gap region 62 of cell placement fixture 58, having dimensions of 0.772 inches by 0.454 inches, provides a guide for the placement of a soldering foil onto the circuit board plate and for the placement of a solar cell on top of the solder after the soldering foil is melted. Note that although multiple electrical connections must be created between the solar cell and the circuit board plate (as explained above in connection with FIG. 6) only a single soldering foil need be placed in center gap region 62, because the solder when melted will not stick to the fiberglass-epoxy material below the etch line in the copper surface of the circuit board plate and will not stick to the silicon semi-conductor material separating the gold contacts on the back of the solar cell. Side gap regions 64, having dimensions of 0.294 inches by 0.099 inches, provide guides for the placement of soldering foils onto the circuit board plate and the placement of copper tabs 46 and 48 (FIGS. 6 and 7) on top of the solder after the soldering foils have been melted. When the copper tabs are inserted into side gap regions 64, the two top prongs of each tab are sticking straight up.

After the soldering foils have been placed on the circuit board plate, but before the solar cell and the copper tabs are in position over the respective soldering foils, the circuit board plate is placed over a hot plate, causing the soldering foils to melt. Flux is then applied to the solar cells and the tabs, the solar cells and tabs are placed on top of the melted solder, and weights are applied on top of the solar cells and tabs. The circuit board plate is then removed from the hot plate to permit cooling of the solder connections, which takes approximately five minutes, and when the solder is hard cell placement fixtures 58 are removed from the circuit board. It is important that water not be used to cool the circuit board plate, because, due to the fact that the differing materials will contract at differing rates as they cool, the rapid cooling will result in delamination. Then secondary optical elements 40 (FIGS. 6 and 7) are placed over the solar cells and the prongs of the pairs of tabs are folded over wing portions 42 and 44 of each secondary optical element.

In the soldering procedure described above, because all of the solder foils are melted and cooled at the same time, there is no need to wait for hardware to cool down between soldering steps. All 24 solar cells on a single circuit board plate can be soldered in less than an hour, and as quickly as five minutes if the process is automated. In general, the use of a circuit board plate to provide electrical circuit paths, the circuit board plate also functioning as a heat sink and as a structural element of a photovoltaic array, provides a design that utilizes a minimal amount of hardware.

Figure 10:
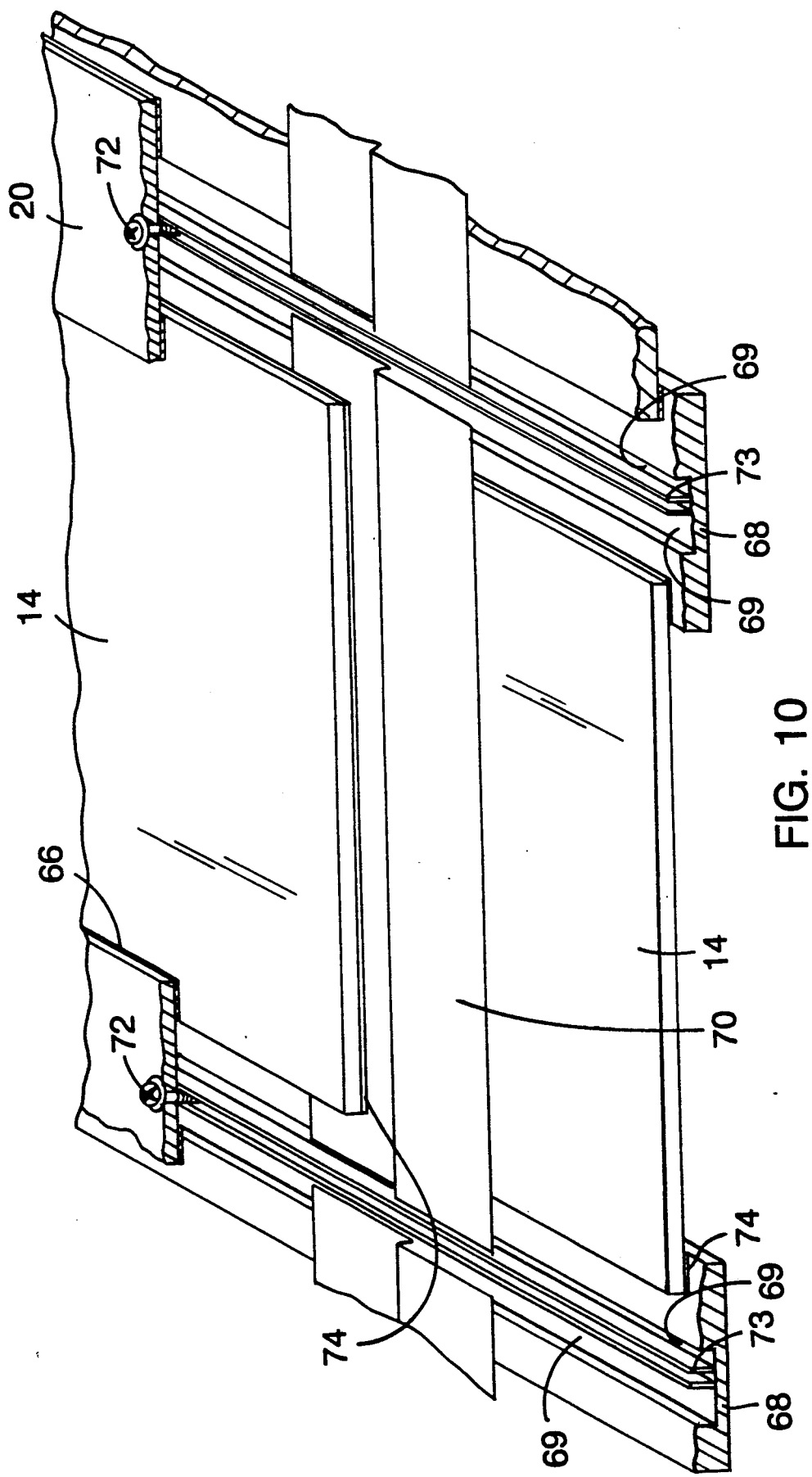
FIG. 10 is a drawing showing a partially cut-away view of a portion of the front surface of a photovoltaic array in accordance with the invention.

With reference to FIG. 10, the top surface of the photovoltaic array includes lens parquets 14 having trim battens 20 placed over the edge regions of each lens parquet. Rubber gaskets 66 are located between trim battens 20 and lens parquets 14 for the purpose of preventing water from entering the array enclosure. Metal gutter plates 68 having gutter channels 69 are provided beneath trim battens 20, running from the top of the front face of the array to the bottom of the front face of the array, for the purpose of capturing water that does leak through gaskets 66 and channeling the captured water off of the array, thereby preventing the captured water from dripping down onto the cell packages inside the photovoltaic array. Screws 72 attach trim battens 20 to extrusion channels 73 provided in gutter plates 68.

Metal water shields 70 ("flashing") extend in the horizontal direction, each water shield having a section located beneath one of the lens parquets, a section located above a portion of another of the lens parquets, and a vertical water-interception section located between the two other sections. Water shields 70 are constructed to capture water that leaks through the gaskets beneath the trim battens that extend in the horizontal direction (not shown), and to prevent the captured water from entering beneath the second of the lens parquets. The captured water is channeled into gutter plates 68 located to the left and to the right of each water shield 70. Rubber gaskets 74 are located between lens parquets 14 and both water shields 70 and gutter plates 68.

Figure 11:
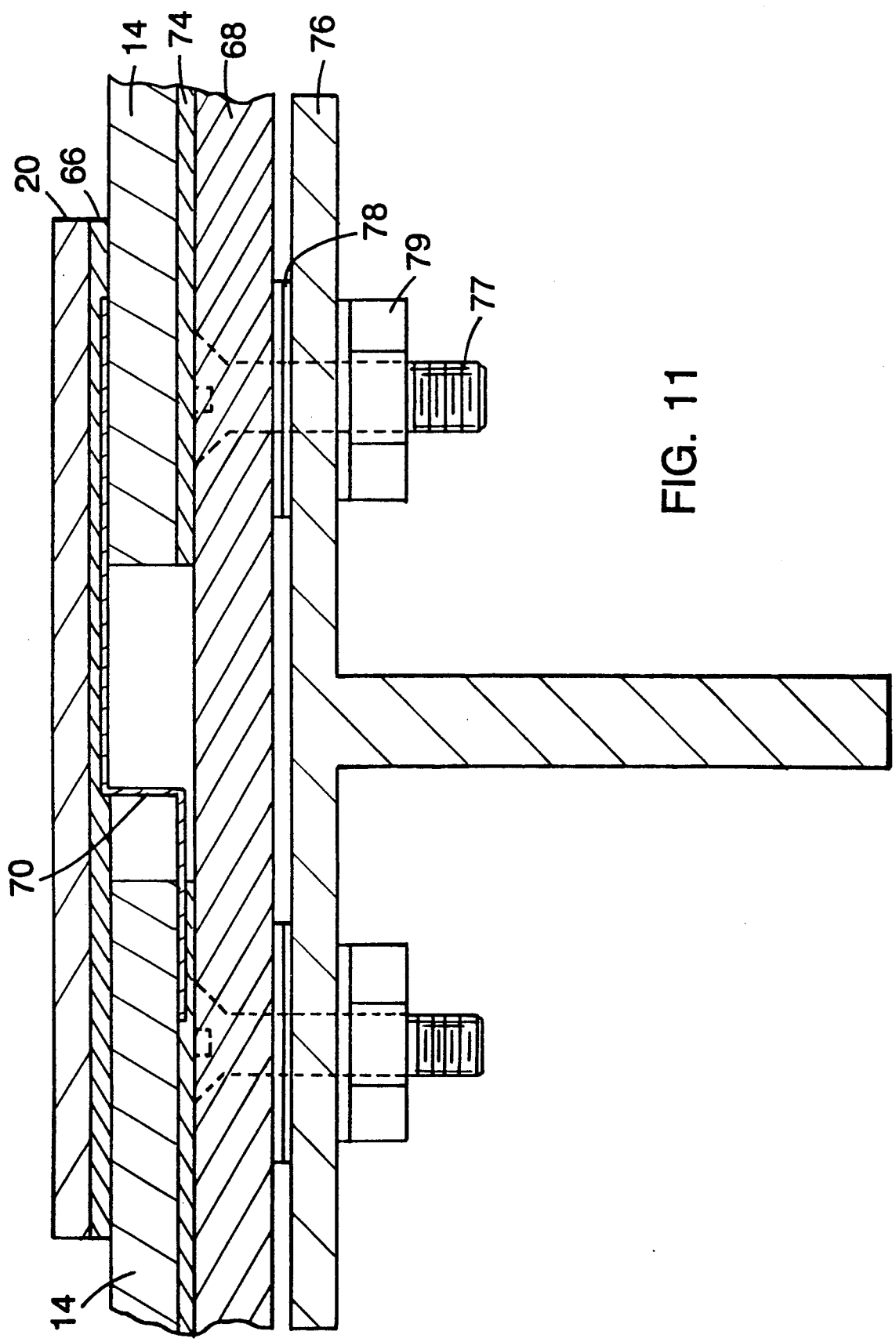
FIG. 11 is a sectional view of a portion of a photovoltaic array in accordance with the invention, taken along line 11—11 in FIG. 1.

With reference to FIG. 11, which shows a sectional view of a portion of the top of the photovoltaic array as taken along line 11—11 in FIG. 1, gutter plate 68 is bolted to internal structural grid member 76 (which forms part of the internal structural grid shown in more detail in FIG. 13) by bolts 77 and nuts 79. Leveling shims 78 are provided between gutter plate 68 and structural grid member 76. By loosening nuts 79 it is possible to remove or add leveling shims 78 between structural grid member 76 and gutter plate 68 to compensate for any warping or sagging of the internal structural grid, thereby enhancing the degree of flatness of the top surface of the array enclosure so that each of lens parquets 14 can directly face the sun. Inaccuracies in the structural grid are especially pronounced at the corners and remote edges of the structural grid. Leveling shims 78 are provided at each of the corners of each lens parquet 14, as well as approximately every 14 inches along the sides of each lens parquet 14 (at two locations along each of the longer sides of each lens parquet and at one location at the center of each of the shorter sides).

After the gutter plates have been bolted to the structural grid and leveled, lens parquets 14 are positioned on top of the structural grid and secured on top of gutter plate 68 by trim battens 20. Gasket 66 is located between trim batten 20 and lens parquets 14, and gasket 74 is located between lens parquets 14 and gutter plate 68. Water shield 70 has one section located beneath one of lens parquets 14, another section located above a portion of another of lens parquets 14, and a vertical water-interception section located between the two other sections.

Figure 12:
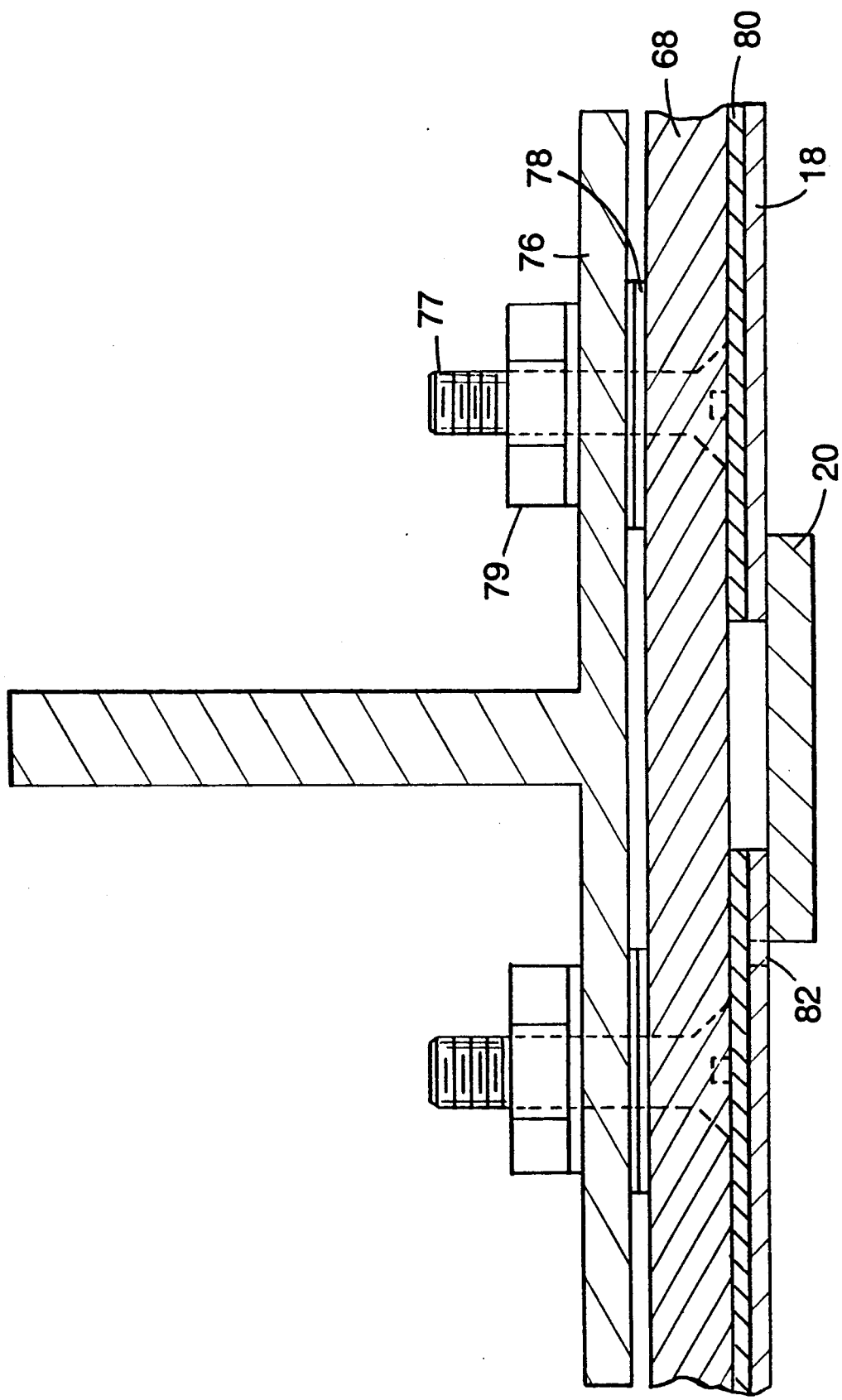
FIG. 12 is a sectional view of a portion of a photovoltaic array in accordance with the invention, taken along line 12—12 in FIG. 2.

With reference to FIG. 12, which shows a sectional view of a portion of the bottom of the photovoltaic array as taken along line 12—12 in FIG. 2, structural grid member 76 is bolted to inverted gutter plate 68, which serves no water-channeling function but is used for the sake of symmetric design simplicity. Leveling shims 78 are provided between gutter plate 68 and structural grid member 76. When a leveling shim is removed near the top surface of the array enclosure to enhance the flatness of the top surface, a leveling shim must be inserted at a corresponding location near the bottom surface of the array enclosure to ensure that the top and bottom surfaces of the array enclosure remain parallel to each other. Likewise, when a leveling shim is removed near the bottom surface, a leveling shim must be inserted near the top surface.

Trim batten 20 secures circuit board plates 18 below gutter plate 68. Gasket 80 is located between circuit board plates 18 and gutter plate 68. One or more weep holes 82, ⅜ inch in diameter, are provided in each of circuit board plates 18 to provide outlets for water that is present inside the array enclosure due to leakage or condensation. Weep holes 82 are drilled through circuit board plate 18 at locations (shown in FIG. 4) above which gasket 80 and gutter plate 68 are not present.

With reference to FIG. 13, which shows a sectional view of a rectangular region of the photovoltaic array between a single lens parquet 14 and a single circuit board plate 18, as taken along line 13-13 in FIG. 1, the internal structural grid includes longitudinal structural grid members 76 (also shown in FIGS. 11 and 12), transverse structural grid members 88, and vertical structural grid members 90. Each rectangular region of the photovoltaic array is bounded by four transverse structural grid members 88, four longitudinal structural grid members 76 (two of which are shown), and four vertical structural grid members 90 (two of which are shown).

The internal structural grid also includes member 84, which extends lengthwise across the middle of the rectangular region of the photovoltaic array. Structural grid member 84, unlike the other structural grid members, passes directly over the electrically alive regions of circuit board plate 18. The bottom of structural grid member 84 is spaced apart from circuit board plate 18. Member piece 84 is clamped to two solid aluminum rods 86 that extend upwards toward lens parquet 14, to which aluminum rods 86 are epoxied. Aluminum rods 86 support lens parquet 14 at two locations separated apart by approximately 14 inches, each location being equidistant (14 inches) from three of the edges of lens parquet 14.

Also shown in FIG. 13 are No. 10 screws 92, which fit through screw holes 30 (FIG. 4) in circuit board plate 18. Screws 92 connect circuit board plate 18 to gasket 80. Note that the trim battens 20 that are located on the corners between the top surface of the enclosure and sheet metal side surface 22 and the corners between the bottom surface of the enclosure and sheet metal side surface 22 wrap around the corner to clamp the sheet metal in place so that wind forces will not blow the sheet metal off of the photovoltaic array.

The internal structural grid is of a type that does not include a torque tube extending in the horizontal direction. Such a torque tube can occupy a substantial amount of space. Consequently, it is possible to provide lens parquets across the entire front surface of the photovoltaic array and to distribute solar cells uniformly throughout the entire inside of the photovoltaic array, except at the single location at which the pedestal attaches to the structural grid.

Other embodiments are within the following claims. E.g., many features of the invention, such as the use of a circuit board to which a solar cell is electrically connected and that also functions as a heat sink, can be practiced in devices other than the integrated array constructed around a structural grid as described above.

What is claimed is:

1. An extensive photovoltaic array for generating electric power from solar radiation as in a power plant, comprising
   an extensive unitary structural grid having substantial extent in both x and y directions and supported on a pedestal, said unitary structural grid being directly attached to said pedestal, said unitary structural grid being defined by a multiplicity of structural members connected to one another at angles and defining spaces therebetween, said structural grid having a depth sufficient to provide structural rigidity to said photovoltaic array,
   a large multiplicity of lens assemblies, each comprised of at least one lens, directly supported by structural members of said unitary structural grid, said lens assemblies closing the upper side of said unitary structural grid,
   all other sides of said unitary structural grid being closed by a plurality of enclosure plates directly supported by structural members of said unitary structural grid in a manner such that at least a portion of said unitary structural grid is enclosed within a space defined by said plates and said lens assemblies, and
   a plurality of solar cells located within said space in which at least a portion of said unitary structural grid is enclosed and positioned to receive solar radiation that passes through respective lenses of said lens assemblies,
   whereby said lens assemblies, said structural members of said structural grid, said solar cells, and said enclosure plates have an integrated relationship.

2. A photovoltaic array in accordance with claim 1, wherein the lower side of said unitary structural grid is closed by a large multiplicity of circuit board plates on which said plurality of solar cells are mounted and to which said plurality of solar cells are electrically connected, said circuit board plates being directly supported by and in spaces defined between structural members of said unitary structural grid.

3. A photovoltaic array in accordance with claim 2, wherein each of said circuit board plates comprises a planar electrically insulative layer, an upper electrically and thermally conductive layer supported by and in heat-transferring relationship to said electrically insulative layer, and a thermally conductive heat sink member extending under said electrically insulative member in heat transferring relationship therewith.

4. A photovoltaic array in accordance with claim 3, wherein said electrically insulative layer comprises a sheet-form member of fiberglass and epoxy.

5. A photovoltaic array in accordance with claim 4, wherein said electrically insulative layer has a thickness on the order of 3 thousandths of an inch, and a dielectric strength on the order of 4000 volts.

6. A photovoltaic array in accordance with claim 3, wherein a material comprising said heat sink member is anodized to form an anodized electrically insulative film forming said electrically insulative layer.

7. A photovoltaic array in accordance with claim 6, wherein said electrically insulative layer has a dielectric strength on the order of 800 volts.

8. A photovoltaic array in accordance with claim 3, wherein said upper electrically and thermally conductive layer of each of said circuit board plates has at least one interruption that electrically isolates a portion of said upper electrically and thermally conductive layer near edges of said circuit board plate from other portions of said upper electrically and thermally conductive layer.

9. A photovoltaic array in accordance with claim 3, wherein
   said upper electrically conductive layer of each of said circuit board plates is interrupted so that adjacent portions thereof are electrically isolated and also serve as positive and negative conductors, and
   at least one solar cell spans across a region of interruption in said upper electrically conductive layer and is secured in electrical and heat conductive relationship to positive and negative portions of said conductive layer.

10. A photovoltaic array in accordance with claim 3, wherein each of said circuit board plates has at least one of said plurality of solar cells electrically connected to said upper electrically and thermally conductive layer by means of at least one solder connection.

11. A photovoltaic array in accordance with claim 3, wherein
    each of said circuit board plates has a plurality of said solar cells electrically connected to said upper electrically and thermally conductive layer, and
    each of said solar cells is connected directly to a pair of circuit nodes between which at least one other of said solar cells is directly connected in parallel fashion,
    said solar cells being arranged in a plurality of sets of parallelly connected solar cells, said sets of parallelly connected solar cells being connected in series, whereby current passing through any solar cell in one of said plurality of sets can pass through any solar cell in an adjacent one of said plurality of sets.

12. A photovoltaic array in accordance with claim 2, wherein said multiplicity of circuit board plates are interconnected by electrical conductors located entirely within said closed photovoltaic array, said electrical conductors electrically interconnecting said plurality of solar cells that are electrically connected to said multiplicity of circuit board plates.

13. A photovoltaic array in accordance with claim 1, further comprising a plurality of removable shims positioned at locations on said structural grid to compensate for structural variations in said structural grid to enhance the degree of flatness of the upper side of said photovoltaic array comprising said lens assemblies and the degree of flatness of the lower side of said photovoltaic array.

14. A photovoltaic array in accordance with claim 1, wherein
said pedestal comprises a vertical post,
said lens assemblies are disposed uniformly across said upper side of said structural grid except at a position at which said vertical post is located, and
said solar cells are disposed uniformly throughout said photovoltaic array except at a location at which said vertical post is located.

15. A photovoltaic array in accordance with claim 1, further comprising a plurality of gutters at the upper side of said array located beneath gaps between said lens assemblies and arranged to capture water that passes into said gaps and to channel said water off of said photovoltaic array, thereby preventing captured water from entering said photovoltaic array.

16. A photovoltaic array in accordance with claim 1, further comprising a plurality of water shield plates at the upper side of said array, each of said water shield plates comprising a first section located beneath an edge margin of a first of said lens assemblies, a second section located above an edge margin of a second of said lens assemblies, and a vertical water-interception surface extending between said first and second sections, constructed to intercept water and to prevent such water from entering beneath said second of said lens assemblies.

17. A photovoltaic array in accordance with claim 1, wherein means closing at least one side of said unitary structural grid has at least one weep hole sized and located to permit water inside said photovoltaic array to escape from said photovoltaic array.

18. A photovoltaic array in accordance with claim 1, wherein said structural grid provides physical support for each of said lens assemblies at edge regions of said lens assemblies and said array includes means to support a center region of each of said lens assemblies.

19. A photovoltaic array in accordance with claim 1, wherein the distance between said lens assemblies and said solar cells is established by said depth of said structural grid.

20. A photovoltaic array in accordance with claim 19, wherein said distance between said lens assemblies and said solar cells is sized to cause each lens to focus said solar radiation so that all focal points are located at or below a plane, parallel to said lens, that passes through the respective solar cell.

21. A photovoltaic array in accordance with claim 20, wherein
all of said focal points are located below said plane, and
said solar radiation passing through said lens forms a pattern on said solar cell that has dimensions substantially equal to the dimensions of an active area of said solar cell.

22. A photovoltaic array in accordance with claim 20, wherein said solar cells and said lenses have relative dimensions such that a ratio of concentration of said solar radiation incident on said solar cells relative to concentration of said solar radiation before passing through said lenses is between approximately 150 and 250.

23. A device for generating electric power from solar radiation, comprising
a circuit board plate comprised of a planar electrically insulative layer, an upper electrically and thermally conductive layer supported by and in heat-transferring relationship to said electrically insulative layer, and a thermally conductive heat sink member extending under said electrically insulative member in heat transferring relationship therewith, said upper electrically conductive layer being interrupted so that adjacent portions thereof are electrically isolated and also serve as positive and negative conductors, and
a solar cell spanning across a region of interruption in said upper electrically conductive layer and secured in electrical and heat conductive relationship to positive and negative portions of said conductive layer,
said circuit board plate comprising a structural element of a housing that defines a space within which said solar cell is located, said upper electrically and thermally conductive layer forming an inner surface of said housing and being exposed to said space within said housing, said thermally conductive heat sink member forming an outer surface of said housing.

24. A device in accordance with claim 23, wherein said electrically insulative layer comprises a sheet-form member of fiberglass and epoxy.

25. A device in accordance with claim 24, wherein said electrically insulative layer has a thickness on the order of 3 thousandths of an inch, a dielectric strength on the order of 4000 volts.

26. A device in accordance with claim 23, wherein a material comprising said heat sink member is anodized to form an anodized electrically insulative film forming said electrically insulative layer.

27. A device in accordance with claim 26, wherein said electrically insulative layer has a dielectric strength on the order of 800 volts.

28. A device in accordance with claim 23, wherein said upper electrically and thermally conductive layer of said circuit board plate has at least one interruption that electrically isolates a portion of said upper electrically and thermally conductive layer near edges of said circuit board plate from other portions of said upper electrically and thermally conductive layer.

29. A device in accordance with claim 28, wherein said circuit board plate has at least one weep hole sized to permit water to pass therethrough, said weep hole being located in a portion of said circuit board plate that is near an edge of said circuit board plate and that is outside said interruption on said upper electrically and thermally conductive layer.

30. A device in accordance with claim 23, wherein said solar cell is electrically connected to said upper electrically and thermally conductive layer by means of at least one solder connection.

31. A device in accordance with claim 23, wherein
said device comprises a plurality of solar cells located on said circuit board plate and electrically connected to said upper electrically and thermally conductive layer, and each of said solar cells is connected directly to a pair of circuit nodes between which at least one other of said solar cells is directly connected in parallel fashion, said solar cells being arranged in a plurality of sets of parallelly connected solar cells, said sets of parallelly connected solar cells being connected in series, whereby current passing through any solar cell in one of said plurality of sets can pass through any solar cell in an adjacent one of said plurality of sets.

32. An extensive photovoltaic array for generating electric power from solar radiation as in a power plant, comprising a large multiplicity of co-planar lens assemblies, said lens assemblies closing an upper side of said photovoltaic array, each of said lens assemblies comprising at least one lens, a plurality of solar cells located below said lens assemblies, each of said solar cells being positioned to receive solar radiation that passes through a lens in one of said plurality of lens assemblies, a plurality of horizontally extending water shield plates associated with corresponding horizontal edges of said lens assemblies, each of said water shield plates comprising a first section located beneath an edge margin of a first of said lens assemblies, a second section located above an edge margin of a second of said lens assemblies, said first of said lens assemblies being positioned higher than said second of said lens assemblies, and an upright water-interception surface extending between said first and second sections in a direction substantially perpendicular to the plane defined by the upper side of the array, constructed to intercept water and to prevent such water from entering beneath said second of said lens assemblies, a plurality of inclined gutters associated with corresponding inclined lens assembly edges located beneath gaps between adjacent co-planar lens assemblies and arranged to capture water intercepted and horizontally diverted by said upright water-interception surface of said water shield plates and to channel captured water off of said photovoltaic array, thereby preventing captured water from entering said photovoltaic array.

33. A photovoltaic array in accordance with claim 32, wherein said enclosure further comprises a plurality of trim battens located above said gaps between said co-planar lens assemblies and located above said water shield plates, and further comprises a plurality of gaskets located between said trim battens and portions of said lens assemblies and said water shield plates that are covered by said trim battens.

34. A method of manufacturing a device for generating electric power from solar radiation, comprising the steps of applying a soldering flux to a circuit board plate, positioning a cell placement fixture over said circuit board plate in a first position, said circuit board plate having structures that engage said cell placement fixture to provide precise positioning of said cell placement fixture on said circuit board plate, placing a first soldering foil on a first region of said circuit board plate that is unobstructed by said cell placement fixture, said cell placement fixture having sides that engage said first soldering foil during placement of said first soldering foil on said first region of said circuit board plate, melting said first soldering foil, applying a soldering flux to a first solar cell, placing said first solar cell over melted solder resulting from melting of said first soldering foil, said cell placement fixture having sides that engage said first solar cell during placement of said first solar cell on said first region of said circuit board plate, permitting said melted solder to cool, to provide at least one solder connection between said first solar cell and said circuit board plate, removing said cell placement fixture from said first position on said circuit board plate, positioning a cell placement fixture over said circuit board plate in a second position, said circuit board plate having structures that engage said cell placement fixture to provide precise positioning of said cell placement fixture on said circuit board plate, placing a second soldering foil on a second region of said circuit board plate that is unobstructed by said cell placement fixture, said cell placement fixture having sides that engage said second soldering foil during placement of said second soldering foil on said second region of said circuit board plate, melting said second soldering foil, applying a soldering flux to a second solar cell, placing said second solar cell over melted solder resulting from melting of said second soldering foil, said cell placement fixture having sides that engage said second solar cell during placement of said second solar cell on said second region of said circuit board plate, permitting said melted solder to cool, to provide at least one solder connection between said second solar cell and said circuit board plate, and removing said cell placement fixture from said second position on said circuit board plate.

35. A method in accordance with claim 34, wherein said soldering foil provides a plurality of solder connections between said solar cell and said circuit board plate.

36. A method in accordance with claim 34, further comprising the steps of placing soldering foils on a plurality of other regions of said circuit board plate that are unobstructed by said cell placement fixture, melting said soldering foils, placing a plurality of tabs over melted solder resulting from melting of said soldering foils on said plurality of other regions of said circuit board plate, said placement fixture providing a physical guide for placement of said soldering foils and said plurality of tabs onto said plurality of other regions of said circuit board plate, and permitting said melted solder to cool, to provide solder connections between said plurality of tabs and said circuit board plate.

37. A method in accordance with claim 36, further comprising the steps of placing a secondary optical element over said solar cell, and folding said tabs over portions of said secondary optical element to secure said secondary optical element in position over said solar cell.

38. A method in accordance with claim 34, wherein said circuit board plate comprises a plurality of depressions, said cell placement fixture comprises a plurality of legs, and said step of positioning said cell placement fixture over said circuit board plate comprises inserting said plurality of legs into said plurality of depressions.

39. A method in accordance with claim 34, further comprising the steps of positioning a plurality of cell placement fixtures over said circuit board plate, said circuit board plate having structures that engage said plurality of cell placement fixtures to provide precise positioning of said plurality of cell placement fixtures on said circuit board plate, placing a plurality of soldering foils on a plurality of regions of said circuit board plate that are unobstructed by a plurality of cell placement fixtures, said cell placement fixtures having sides that engage said soldering foil during placement of said soldering foil on said plurality of regions of said circuit board plate, simultaneously melting said soldering foils, applying soldering flux to a plurality of solar cells, placing said plurality of solar cells over melted solder resulting from melting of said soldering foils, said cell placement fixtures having sides that engage said solar cells during placement of said solar cells on said plurality of regions of said circuit board plate, simultaneously cooling said solder connections, to provide at least one solder connection between each of said solar cells and said circuit board plate, and removing said plurality of cell placement fixtures from said circuit board plate.

40. A method of manufacturing a device for generating electric power from solar radiation, comprising the steps of placing a soldering foil on a circuit board plate, said circuit board plate being comprised of a planar electrically insulative layer, an upper electrically and thermally conductive layer supported by and in heat-transferring relationship to said electrically insulative layer, and a thermally conductive heat sink member extending under said electrically insulative member in heat transferring relationship therewith, said upper electrically conductive layer being interrupted so that adjacent portions thereof are electrically isolated and also serve as positive and negative conductors, said soldering foil spanning across a region of interruption in said upper electrically conductive layer, melting said soldering foil, placing said solar cell over melted solder resulting from melting of said soldering foil, permitting said melted solder to cool, to secure said solar cell in electrical and heat conductive relationship to positive and negative portions of said conductive layer, and forming a housing that defines a space within which said solar cell is located, said circuit board plate comprising a structural element of said housing, said upper electrically and thermally conductive layer forming an inner surface of said housing and being exposed to said space within said housing, said thermally conductive heat sink member forming an outer surface of said housing.

41. A method in accordance with claim 40, further comprising the step of forming an interruption on said upper electrically and thermally conductive layer of said circuit board plate that isolates a portion of said upper electrically and thermally conductive layer near edges of said circuit board plate from other portions of said upper electrically and thermally conductive layer.

42. A method in accordance with claim 41, further comprising the step of forming at least one weep hole in said circuit board plate sized and located to permit which water to pass therethrough, said weep hole being located in a portion of said circuit board plate that is near an edge of said circuit board plate and that is outside said interruption on said upper electrically and thermally conductive layer.

43. A method in accordance with claim 40, further comprising the steps of placing a plurality of soldering foils on said circuit board plate, melting said plurality of soldering foils, placing a plurality of solar cells over melted solder resulting from melting of said plurality of soldering foils, and permitting said melted solder to cool, to connect each of said solar cells directly to a pair of circuit nodes on said circuit board plate between which at least one other of said solar cells is directly connected in parallel fashion, said solar cells being arranged in a plurality of sets of parallelly connected solar cells, said sets of parallelly connected solar cells being connected in series, whereby current passing through any solar cell in one of said plurality of sets can pass through any solar cell in an adjacent one of said plurality of sets.

* * * * *

UNITED STATES PATENT AND TRADEMARK OFFICE
CERTIFICATE OF CORRECTION

PATENT NO.  : 5,125,983
DATED       : June 30, 1992
INVENTOR(S) : Richard D. Cummings It is certified that error appears in the above-indentified patent and that said Letters Patent is hereby corrected as shown below:

On the Title page, item [56], under References cited; "3,574,725" should be --3,574,925--.

Signed and Sealed this

Nineteenth Day of October, 1993

Attest:

BRUCE LEHMAN

Attesting Officer   Commissioner of Patents and Trademarks